(12) United States Patent
Wong et al.

(10) Patent No.: US 8,457,921 B2
(45) Date of Patent: Jun. 4, 2013

(54) ELECTRONIC DEVICE TESTER AND TESTING METHOD

(75) Inventors: Shih-Fang Wong, Taipei Hsien (TW); Xin Lu, Shenzhen (CN); Jia-Hong Yang, Shenzhen (CN); Peng Tang, Shenzhen (CN); Hui-Feng Liu, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 324 days.

(21) Appl. No.: 12/955,908

(22) Filed: Nov. 30, 2010

(65) Prior Publication Data

US 2012/0053883 A1     Mar. 1, 2012

(51) Int. Cl.
*G01R 31/00*     (2006.01)
*G06F 19/00*     (2006.01)

(52) U.S. Cl.
USPC ............................................. 702/120; 714/37

(58) Field of Classification Search
USPC ...................... 702/108, 117–123; 714/37, 45
See application file for complete search history.

(56) References Cited

U.S. PATENT DOCUMENTS

| | | | |
|---|---|---|---|
| 6,421,793 B1 * | 7/2002 | Lester et al. | 714/37 |
| 7,409,603 B2 * | 8/2008 | Shu et al. | 714/45 |

* cited by examiner

*Primary Examiner* — John H Le
(74) *Attorney, Agent, or Firm* — Altis Law Group, Inc.

(57) ABSTRACT

An electronic device tester is connected to an electronic device needed to be tested. A test program is stored in a data storage of the tester. The test program includes a number of test instructions. The tester encapsulates the test instructions of the test program to a number of script files, stores the script files to the data storage, and records a name of each script file to the test program. After the test instruction is encapsulated, the tester selects desired script files of the test program and calls the selected script files according to the names of the script files to implement the test program to test the electronic device.

6 Claims, 4 Drawing Sheets

ELECTRONIC DEVICE TESTER AND TESTING METHOD

BACKGROUND

1. Technical Field

The present disclosure relates to a electronic device tester and a method thereof.

2. Description of Related Art

Before electronic devices leave the factory, they should be tested. A test program may be provided for factory testing of the electronic devices. Generally, each test program can test a number of functions/elements, such as microphone, display, and data storage, of the electronic devices. Any changes in the functions/elements of the electronic device will necessitate the need to update or even rewrite the test program, which is costly and inefficient.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
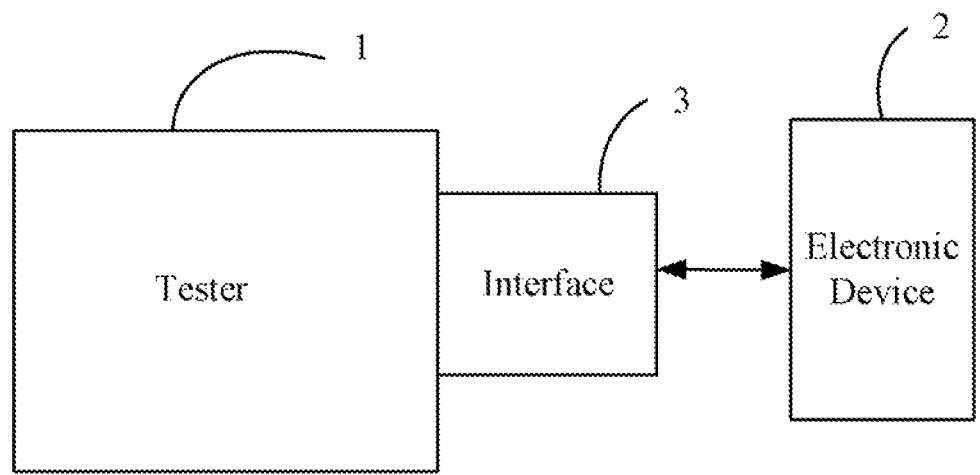
FIG. 1 is a schematic diagram of a tester for testing an electronic device in accordance with an exemplary embodiment.

FIG. 1 is a schematic diagram of a tester 1 for testing an electronic device 2 in accordance with an exemplary embodiment. The tester 1 connects to the electronic device 2 through an interface 3.

Figure 2:
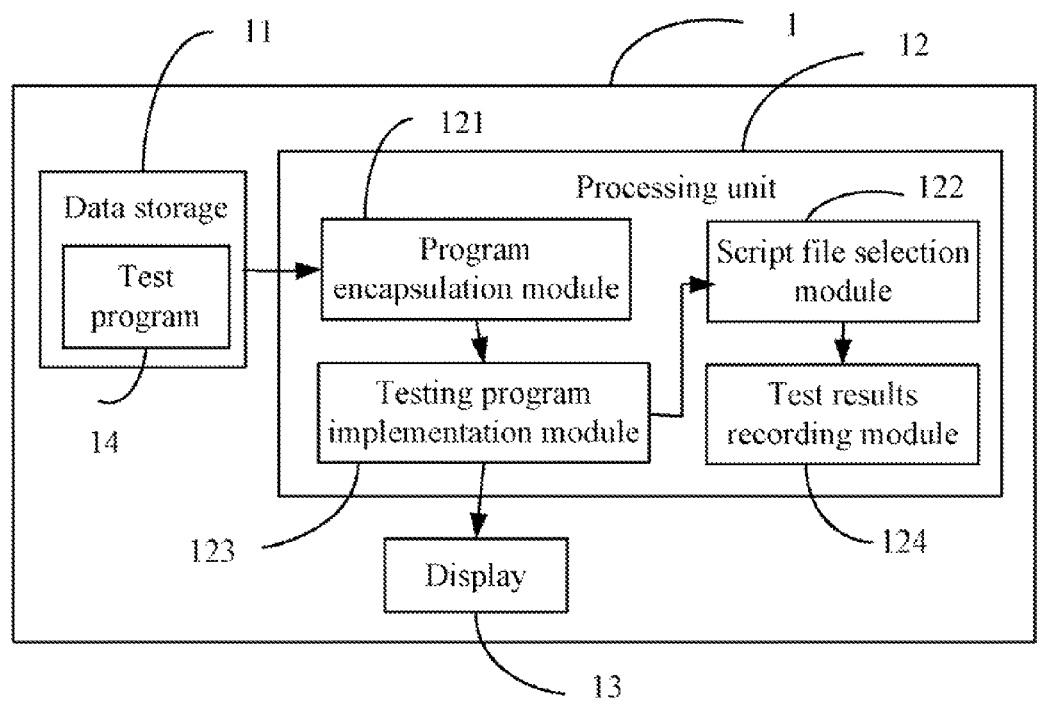
FIG. 2 is a block diagram of the tester of FIG. 1.

FIG. 2 is a block diagram of the tester 1 of FIG. 1. The tester 1 includes a data storage 11, a processing unit 12, a display 13, and other components (not shown). The data storage 11 stores a testing grogram 14 for testing the electronic device 2. The test program 14 includes a number of test items. Each test item, including a number of test instructions, is used to test one function or element of the electronic device 2.

The processing unit 12 includes a program encapsulation module 121, a script file selection module 122, a test program implementation module 123, and a test results recording module 124. The program encapsulation module 121 encapsulates the test instructions of the test program 14 in a number of script files. The script files are stored in the data storage 11. A name of each script file is recorded in the test program 14. The program encapsulation module 121 is capable of encapsulating the test instructions in different manners if needed. For example, in a first manner, the encapsulation module 121 encapsulates each test instruction in a separate script file; in a second manner, the encapsulation module 121 encapsulates a number of test instructions in one script file; in a third manner, the encapsulation module 121 encapsulates the test instructions of each test item together in one script file By encapsulating parts of the test program, then when the program needs to be updated, only the specific parts need to be changed rather than rewriting in a large program.

Figure 3:
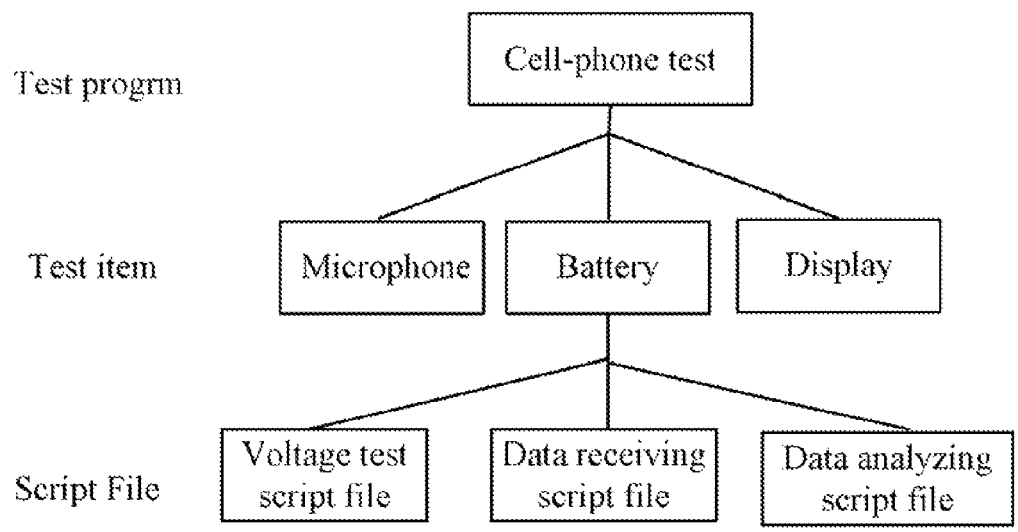
FIG. 3 is a schematic diagram of component structure of a test program stored in the tester of FIG. 1.

The script file selection module 122 selects script files of the test program 14 in response to a user selection made using the tree-like component structure. In this embodiment, as shown in FIG. 3, the encapsulated script files are organized in a tree-like component structure for selection. For better understanding the present disclosure, a cell-phone test is provided as an example. The test program 14 for the cell-phone test includes a microphone test item, a display test item, and a battery test item. In this embodiment, the battery test item includes a voltage test instruction for testing the voltage of the cell-phone battery, a data receiving instruction for receiving data from the cell-phone 2, and a data analyzing instruction for analyzing the received data to generate test results. The voltage test instruction, the data receiving instruction, and the data analyzing instruction are encapsulated in a voltage test script file, a data receiving script file, and a data analyzing script file respectively. Therefore, when testing the battery, only the voltage test script file, the data receiving script file, and the data analyzing script file are selected.

The test program implementation module 123 calls the selected script files from the data storage 11 according to the names of the selected script files recorded in the test program 14 to implement the test program 14. After the test program 14 is implemented, the test program implementation module 123 receives the test results, and displays the test results on the display 12.

The test results recording module 124 records the test results to the data storage 11.

Figure 4:
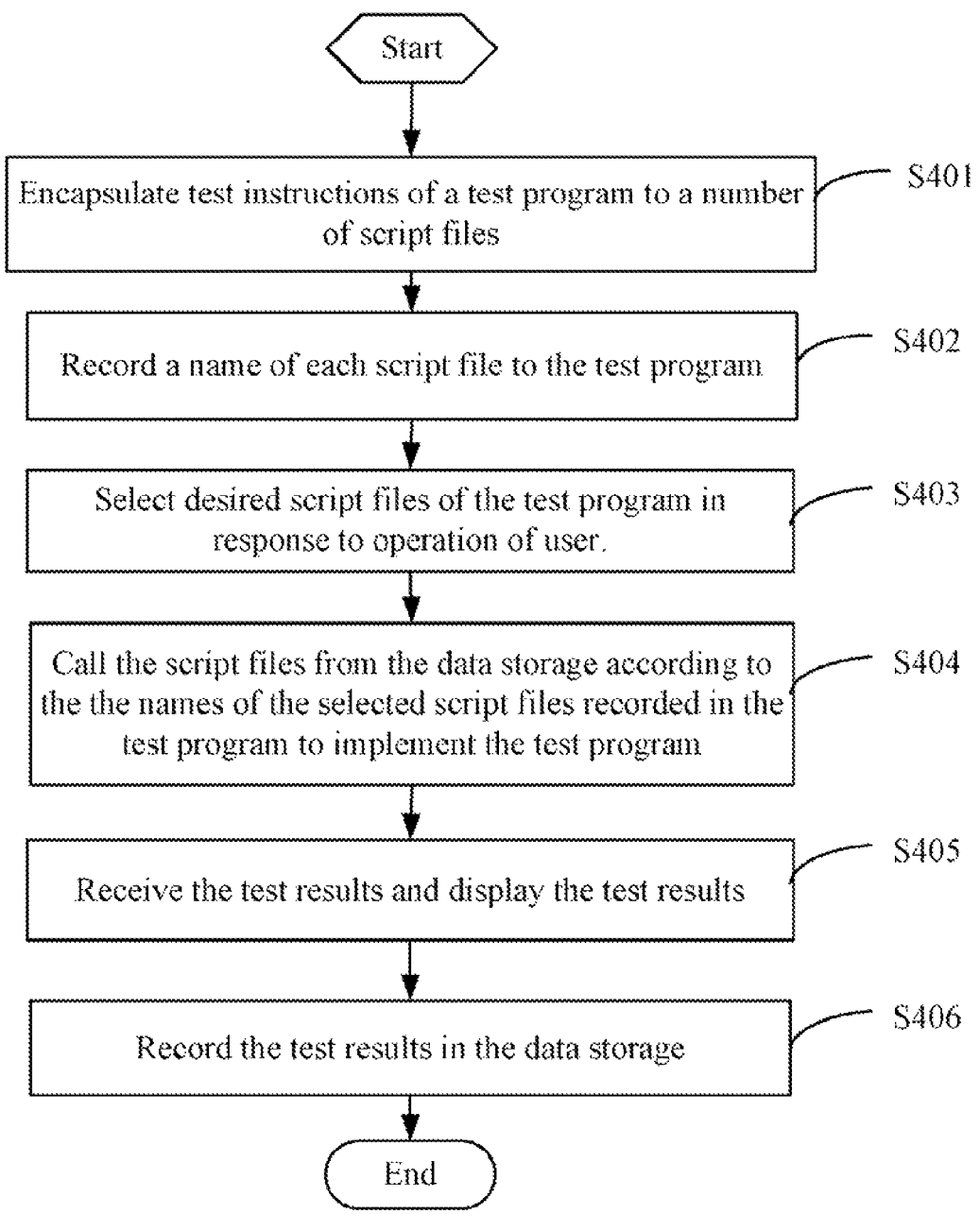
FIG. 4 is a flowchart of an electronic device testing method applied to the tester of FIG. 1.

FIG. 4 is a flowchart of an electronic device testing method applied to the tester of FIG. 1. In step S401, the program encapsulation module 121 encapsulates the test instructions of the test program 14 in a number of script files.

In step S402, the program encapsulation module 121 records a name of each script file to the test program 14.

In step S403, the script file selection module 122 selects desired script files of the test program 14 in response to the operation of the user.

In step S404, the test program implementation module 123 calls the script files from the data storage 11 according to the names of the script files recorded in the test program 14 to implement the test program 14.

In step S405, the test program implementation module 123 receives the test results and displays the test results on the display 12.

In step S406, the test results recording module 124 records the test results and stores the test results in the data storage 11.

Although, the present disclosure has been specifically described on the basis of preferred embodiments, the disclosure is not to be construed as being limited thereto. Various changes or modifications may be made to the embodiment without departing from the scope and spirit of the disclosure.

What is claimed is:

1. An electronic device tester for testing an electronic device comprising:
   a data storage storing a test program comprising a plurality of test items, each test item comprising a plurality of test instructions; and
   a processing unit, comprising:
      a program encapsulation module for encapsulating the test instructions of the test program in a plurality of script files in different manners, and recording a name of each script file for the test program, wherein the different manners comprise a first manner, a second manner, and a third manner; in the first manner, the encapsulation module encapsulates each test instruction in a separate script file; in the second manner, the encapsulation module encapsulates a number of test instructions in one script file; in the third manner, the encapsulation module encapsulates the test instructions of each test item together in one script file;
a script file selection module for selecting desired script files of the test program;
a test program implementation module for calling the selected script files according to the name of each selected script file to implement the test program, and causing the test results to be displayed to a user.

2. The tester as described in claim 1, wherein the processing unit further comprises a test results recording module for recording the test results to the data storage.

3. The tester as described in claim 1, wherein the script files of the test program is recorded as tree-like component structure.

4. An electronic device testing method implemented by a tester comprising a processing unit and a data storage, the data storage storing a test program comprising a plurality of test items, each test item comprising a plurality of test instructions, the testing method comprising:
the processing unit encapsulating the test instructions of the test program to a plurality of script files in different manners, wherein the different manners comprises a first manner, a second manner, and a third manner; in the first manner, the encapsulation module encapsulates each test instruction in a separate script file; in the second manner, the encapsulation module encapsulates a number of test instructions in one script file; in the third manner, the encapsulation module encapsulates the test instructions of each test item together in one script file;
the processing unit recording a name of each script file to the test program;
the processing unit selecting desired script files of the test program;
the processing unit calling the selected script files from the electronic device according to the name of each selected script file to implement the test program; and
the processing unit causing the test results to be displayed.

5. The testing method as described in claim 4, further comprising:
the processing unit recording the test results in the tester.

6. The testing method as described in claim 4, wherein the script files of the test program are recorded as tree-like component structure.

\* \* \* \* \*